United States Patent
Altin

(10) Patent No.: US 7,556,840 B2
(45) Date of Patent: Jul. 7, 2009

(54) COATING USING METAL ORGANIC CHEMICAL VAPOR DEPOSITION

(75) Inventor: Orhan Altin, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 355 days.

(21) Appl. No.: 11/477,535

(22) Filed: Jun. 30, 2006

(65) Prior Publication Data

US 2008/0003361 A1 Jan. 3, 2008

(51) Int. Cl.
C23C 16/40 (2006.01)
C23C 16/00 (2006.01)
C23C 16/06 (2006.01)

(52) U.S. Cl. .............................. 427/255.19; 427/255.31

(58) Field of Classification Search ............ 427/255.19, 427/255.31, 419.2
See application file for complete search history.

(56) References Cited

U.S. PATENT DOCUMENTS

| 5,077,091 A | 12/1991 | Nowak et al. |
| 5,330,611 A | 7/1994 | Doll |
| 5,336,324 A | 8/1994 | Stall et al. |
| 5,453,494 A | 9/1995 | Kirlin et al. |
| 5,544,618 A | 8/1996 | Stall et al. |
| 5,780,110 A | 7/1998 | Schaeffer et al. |
| 6,066,196 A | 5/2000 | Kaloyeros et al. |
| 6,245,435 B1 | 6/2001 | O'Brien et al. |
| 6,495,271 B1 * | 12/2002 | Vakil .......................... 428/632 |
| 6,521,294 B2 | 2/2003 | Rigney et al. |
| 6,723,186 B2 | 4/2004 | Lee et al. |
| 6,777,327 B2 | 8/2004 | Pan et al. |
| 6,849,241 B2 | 2/2005 | Dauelsberg et al. |
| 6,884,466 B2 | 4/2005 | Kaloyeros et al. |

FOREIGN PATENT DOCUMENTS

| EP | 0 504 959 A2 | 9/1992 |
| JP | 9 143684 | 6/1997 |
| WO | WO-00/47404 A1 | 8/2000 |

* cited by examiner

*Primary Examiner*—Roberts Culbert
(74) *Attorney, Agent, or Firm*—Finnegan, Henderson, Farabow, Garrett & Dunner; David E. Roberts

(57) ABSTRACT

A method is provided for applying a coating over a substrate surface of an engine component. The method includes inserting the engine component within a deposition chamber, heating the deposition chamber to a temperature between 325° C. and 500° C., supplying one or more precursors to the heated deposition chamber, subjecting the engine component to the one or more precursors for about five hours to form an inert oxide layer over the substrate surface of the engine component having a thickness of approximately 1-5 microns.

19 Claims, 3 Drawing Sheets

COATING USING METAL ORGANIC CHEMICAL VAPOR DEPOSITION

TECHNICAL FIELD

This disclosure relates generally to depositing one or more layers onto at least one substrate, and more particularly to coating engine components using metal organic chemical vapor deposition methods.

BACKGROUND

In internal combustion engines, for example, of the gasoline, diesel, and/or gaseous fuel type, fuel and air may be introduced into cylinders for combustion. Pistons may move within the cylinders in order to compress the fuel and air mixture prior to combustion of the mixture. Combustion may then drive the pistons and yield a power output utilized, for example, to drive a machine, such as a stationary or mobile variety, including, for example, an on-highway truck.

Combustion in the cylinder may release energy and generate combustion by-products, most of which may be exhausted from the cylinder into an exhaust system of the engine, for example, during the exhaust phase of the combustion cycle. Engine components, such as pistons, may be exposed to the combustion and combustion by-products which may contain contaminants, for example, hydrocarbons (HC), carbon monoxide (CO), nitric oxides ($NO_x$), soot, and unburned or partially burned fuel. In addition, some engine components, such as pistons, may also be exposed to oil droplets and oil vapor materials draining from other parts of the engine.

Such exposure to the aforementioned combustion products may result in fouling of engine component surfaces, including, for example, piston surfaces. This, in turn, may produce contaminant buildup (e.g., carbon deposits, oil coatings and sludge), on engine component surfaces, the result of which may produce corrosive effects upon these surfaces. A corrosive reaction may reduce the operational service life of the engine components. In addition, contaminants, such as carbon deposit buildup, disposed on surfaces of engine components may negatively affect the performance of the engine including, for example, power production of the engine, increased fuel consumption, and possibly reduce the operational life of the engine.

U.S. Pat. No. 6,884,466 issued to Kaloyeros et al. discloses a process for metal organic chemical vapor deposition for coating substrates. A nitrogen-containing gas is introduced into a deposition chamber by pulsing the nitrogen containing gas to react with an absorbed precursor and create a monolayer on the surface of a substrate. However, because nitrogen may provide an amount of reaction to some substrate materials, including, for example engine components such as surfaces of engine pistons, the deposition method of Kaloyeros et al. may not be sufficient to protect such surfaces from oxidation, corrosion, or contaminants, for example, in an engine operating environment. Furthermore, the coating layer provided by Kaloyeros et al. may not be at a required thickness to allow the coated component to be utilized within an operating environment at an acceptable or efficient level.

The present disclosure is directed towards overcoming one or more of the shortcomings set forth above.

SUMMARY OF THE INVENTION

In accordance with one disclosed exemplary embodiment, a method of applying one or more inert oxide layers on at least one substrate surface may include disposing the substrate surface within a deposition chamber and heating the deposition chamber to a temperature of approximately 325° C. One or more precursors may be supplied to the deposition chamber at approximately 325° C. The substrate surface may be subjected to the one or more precursors at approximately 325° C. for about two hours. The method may further include halting the application of one or more precursors and heating the deposition chamber to a temperature of approximately 375° C. One or more precursors may be supplied to the deposition chamber at approximately 375° C. The substrate surface may be subjected to the one or more precursors at approximately 375° C. for about three hours to form the inert oxide layer.

In accordance with another disclosed exemplary embodiment, a method of applying one or more inert oxide layers on at least one substrate surface may include disposing the substrate surface within a deposition chamber and heating the deposition chamber to a temperature of approximately 325° C. One or more precursors may be supplied to the deposition chamber at approximately 325° C. The substrate surface may be subjected to the one or more precursors at approximately 325° C. for about two hours. The method may further include halting the application of one or more precursors and heating the deposition chamber to a temperature of approximately 375° C. One or more precursors may be supplied to the deposition chamber at approximately 375° C. The substrate surface may be subjected to the one or more precursors at approximately 375° C. for about three hours to form the inert oxide layer. The method may further include halting the treatment of one or more precursors after subjecting the substrate surface to the one or more precursors at approximately 375° C. for about three hours. The deposition chamber may be heated to a temperature of approximately 425° C. One or more precursors may be supplied to the deposition chamber at approximately 425° C. The substrate surface may be subjected to the one or more precursors at approximately 425° C. for about two hours to form an additional inert oxide layer over the first formed inert oxide layer.

According to another exemplary disclosed embodiment, a method is provided for applying a coating over a substrate surface of an engine component. The method includes inserting the engine component within a deposition chamber and heating the deposition chamber to a temperature between 325° C. and 500° C. One or more precursors may be supplied to the heated deposition chamber and the engine component may be subjected to the one or more precursors for about five hours to form an inert oxide layer over the substrate surface of the engine component having a thickness of approximately 1-5 microns.

DETAILED DESCRIPTION

Figure 1:
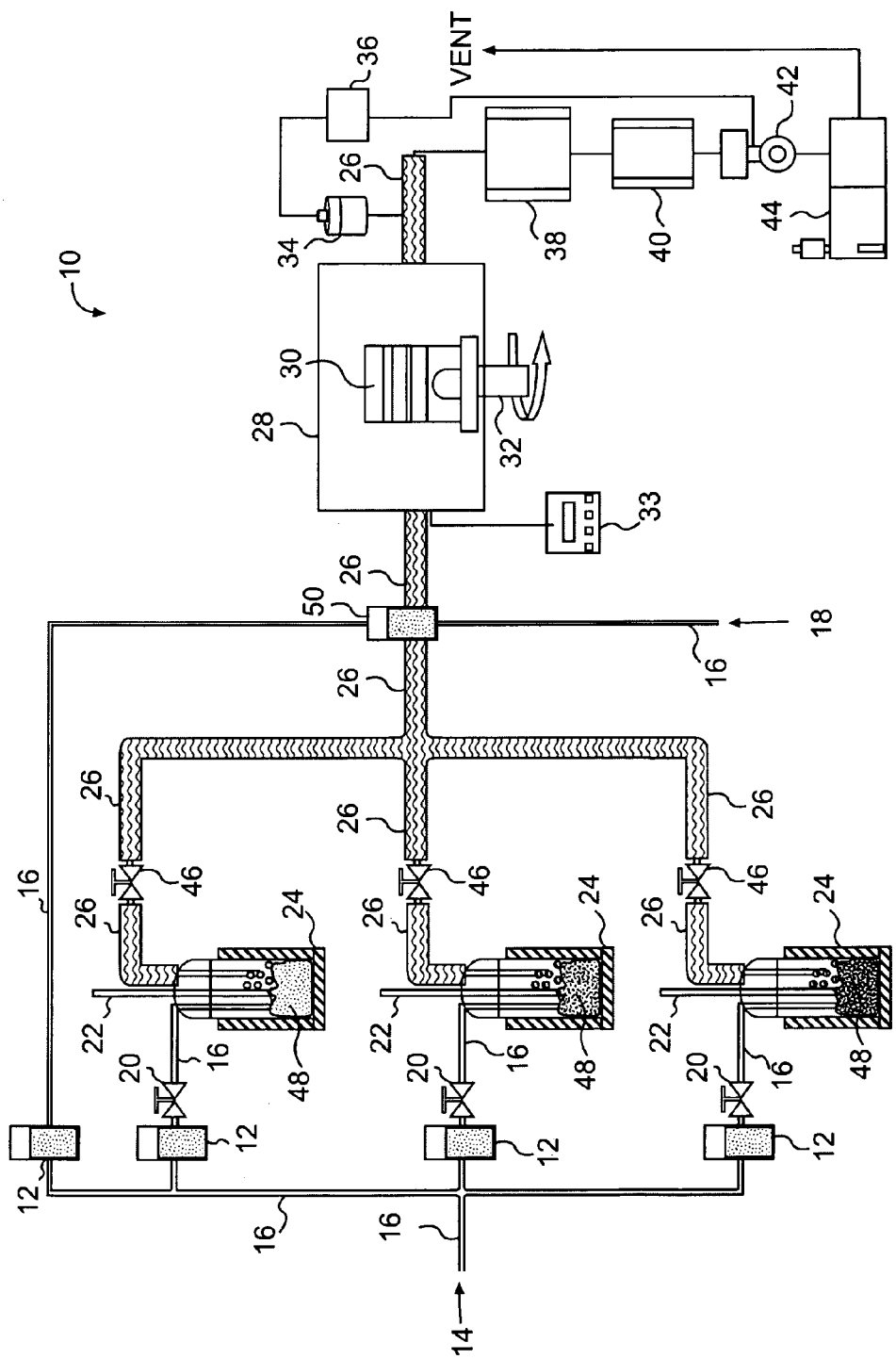
FIG. 1 provides a schematic view of metal organic chemical vapor deposition system according to an exemplary disclosed embodiment.

Referring to the figures, a metal organic chemical vapor deposition (MOCVD) system is shown generally at 10 in FIG. 1. In one embodiment, a source gas 14 may be an inert gas, such as argon, which will generally not react to the surface of a substrate treated by the MOCVD system 10 of the disclosed embodiment. The source gas 14 may serve a variety of purposes including acting as a "carrier gas" for one or more additional components mixed therein. Moreover, the source gas 14 may be utilized to purge the disclosed MOCVD system 10 as further detailed below.

The source gas 14 may be supplied to the MOCVD system 10 through supply lines 16. The supply lines 16 may be connected to respective mass flow controls 12 of the MOCVD system 10. A mass flow control 12 may be coupled directly to a mixing chamber 50 located downstream in the MOCVD system 10. This connection may facilitate cleaning the MOCVD system 10 such as in a purging operation. Additionally, one or more of the mass flow controls 12 may be connected to respective reagent containers 24. Valves 20, such as Swagelok® valves, may be coupled between each mass flow control 12 and a respective reagent container 24. Valves 20 may be controlled to regulate an amount of source gas 14 in the mass flow controls 12 supplied to the reagent containers 24.

Each reagent container 24 may contain an amount of precursors 48 suitable for applying coatings to engine components such as in MOCVD processes. In some disclosed embodiments, the precursors 48 may include materials suitable for applying inert oxide layers such as alumina, alumina-silica, alumina silica multilayers, alumina tantalum and alumina magnesium oxide based materials. More particularly, the precursors 48 may include aluminum acetylacetonate, aluminum magnesium isopropoxide, tantalum ethoxide, tantalum tetraethoxide 2,4pentadionate, tetraethoxysilane, and/or tetyramethoxylane.

The precursors 48 may be heated within the reagent containers 24. In one disclosed embodiment, the precursors 48 may be heated, for example, in a temperature range of approximately 50° C.-200° C. Some disclosed embodiments may include heating the precursors 48 to approximately 100° C. Thermocouples 22 may be utilized to facilitate measuring a temperature in order to control and maintain a desired temperature of the precursors 48.

The source gas 14 may be mixed with the heated precursors 48 within the reagent container 24. The source gas 14 may act as a "carrier gas" for transporting the heated precursors 48 downstream in the MOCVD system 10. The mixed source gas 14 and precursor 48 may be supplied from the reagent containers 24 through heated supply lines 26. Heated supply lines 26 may facilitate maintaining a temperature of the source gas 14 and precursor 48 mix as it is delivered downstream. Valves 46 may be coupled to heated supply lines 26 and utilized to regulate a flow therethrough.

The heated supply lines 26 may be routed to a mixing chamber 50. A supplementary mixing material 18 may be supplied to the mixing chamber 50. The supplementary mixing material 18 may include another inert gas such as $O_2$. The mixing chamber 50 may also be heated to facilitate a chemical reaction between the supplementary mixing material 18 with the mixed source gas 14 and precursors 48 in order to further process the mixture received therein. For example, the reaction may serve to burn off undesirable components, such as hydrocarbon materials, which may still exist in the precursors 48.

The processed mixture may be emitted from the mixing chamber 50 and supplied to a deposition chamber 28. An article, such as an engine component 30, may be disposed within deposition chamber 28 wherein it may be exposed to the processed mixture received from the mixing chamber 50 such as in a MOCVD process. The engine component 30 may include a variety of components suitable to MOCVD processing including, for example, pistons, connecting rods, crankshafts, etc. While engine components have been described as being utilized within deposition chamber 28, any article suitable for MOCVD processing may be utilized by the disclosed system. In one disclosed embodiment, a rotational mechanism 32 may be employed by deposition chamber 28 to more thoroughly expose engine component 30 to processing gases during MOCVD.

A temperature controller 33 may be coupled to the deposition chamber 28 in order to regulate a temperature of the deposition chamber 28. In one embodiment, the deposition chamber 28 may be heated to a temperature range between approximately 325° C.-500° C. in order to produce a desired surface interaction between the processing gases (supplied from the mixing chamber 50) and the exposed surfaces of the engine component 30 such as during a MOCVD process as illustrated, for example, in FIGS. 2-3.

After the engine component 30 is treated, such as by the disclosed embodiment, the enclosed processing gases may be vented from within the deposition chamber 28. In one embodiment, a heated supply line 26 may be utilized to vent exiting gas from within deposition chamber 28. The heated supply line 26 exiting the deposition chamber 28 may facilitate the prevention of condensation of the exiting gas within the line. In one disclosed embodiment, additional equipment may be coupled to the heated supply line 26 in order to further process the gas exiting from deposition chamber 28 prior to venting. Such additional equipment may include a pressure transducer 34, a liquid nitrogen trap 38, a molecular sieve 40, a throttle valve 42, and a pump 44.

The pump 44 may be utilized to propel the exiting gas from within deposition chamber 28 through the heated supply line 26 to be vented. The exiting gas may be directed through the liquid nitrogen trap 38 in order to condense and collect any residual precursors 48 which may also be vented. The exiting gas may also be directed through a molecular sieve 40 in order to collect any residual water that may have formed and is exiting from the deposition chamber 28.

A pressure controller 36 may be coupled between the pressure transducer 34 and the throttle valve 42. In the disclosed embodiment, the pressure measured in the heated supply line 26 exiting the deposition chamber 28 is the same pressure of deposition chamber 28. By measuring the pressure within the heated supply line 26, such as via pressure transducer 34, the pressure controller 36 may regulate the pressure within deposition chamber 28 by signaling a function of the throttle valve 42 to be enabled or disabled.

INDUSTRIAL APPLICABILITY

The disclosed MOCVD system 10 may have applicability in any system, for example, requiring reduction of carbon deposit accumulation on substrate materials, such as piston surfaces including, for example, carbon steel 4140 material. In one embodiment, the MOCVD system 10 may be utilized to apply one or more thin coatings of inert layers to engine components 30 such as pistons. The one or more thin coatings of inert layers applied to the substrate may produce an engine component 30 having a generally chemically non-reactive coating layer which can protect the engine component 30 from oil deposits and/or contaminants in an engine operating environment. These oil deposits and/or contaminants may contain sulfur compounds or hydrocarbons that can damage surfaces of the engine components 30 over time. In some cases, the oil utilized in engines may also contain additives including, for example, detergent additives and antioxidant metal deactivators which may work to decompose contact surfaces of engine component 30 over time.

In operation, the MOCVD system 10 may be purged, for example, to remove oxygen from within the system, prior to applying one or more protective coating layers to an engine component 30. The purging operation may help eliminate contaminants and facilitate an inert operating environment for applying the disclosed protective coating layer. The source gas 14, such as argon, may be dispensed throughout the MOCVD system 10 in order to purge the system.

Figure 2:
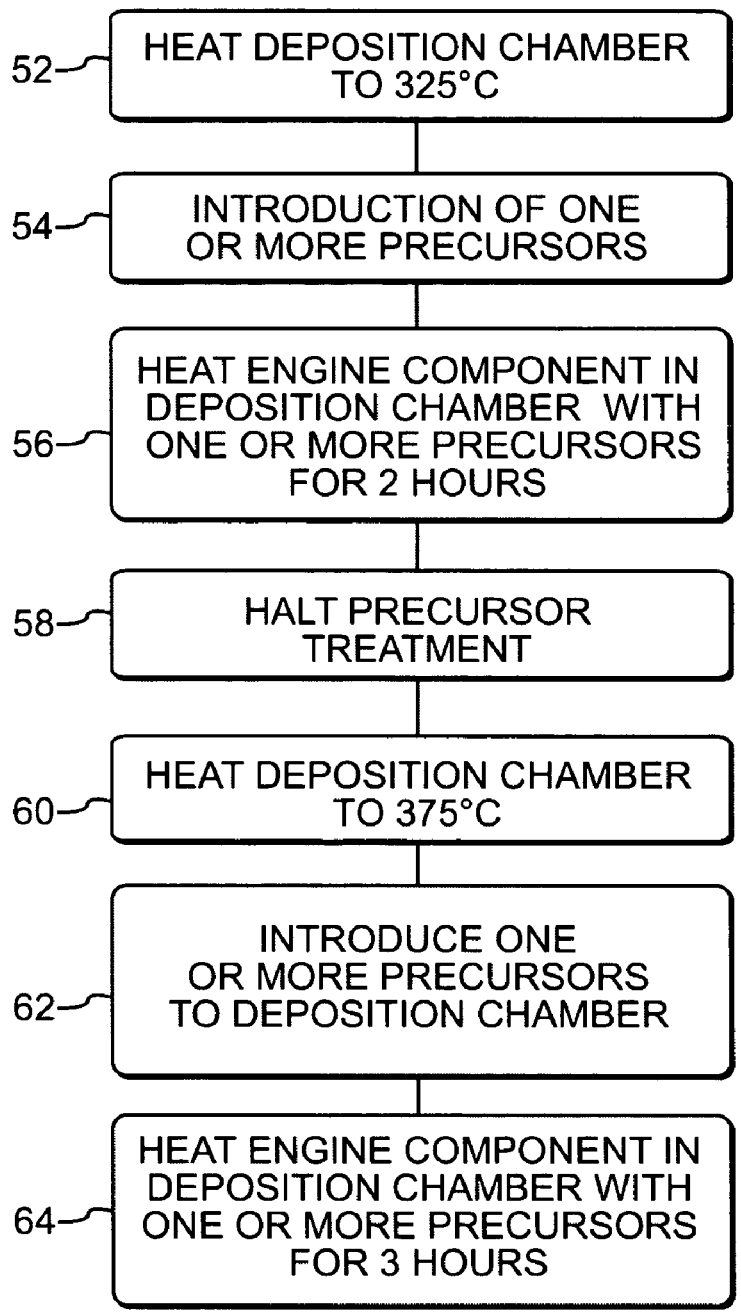
FIG. 2 provides a schematic diagram of the metal organic chemical vapor deposition process according to an exemplary disclosed embodiment.

The engine component may be placed and sealed within the deposition chamber 28 at ambient temperature. In one example, a piston, such as one including carbon steel 4140 material, may be utilized for applying an inert protective coating layer to a substrate surface thereof. The source gas 14 may continue to be supplied to the deposition chamber 28, as necessary, to ensure an inert operating environment. FIG. 2 illustrates a schematic representation of one disclosed embodiment in which the deposition chamber 28 may be heated to approximately 325° C. (step 52). This temperature may provide enough thermal energy to coat the piston without producing oxidation on any surfaces. Once the chamber reaches a temperature of approximately 325° C., one or more precursors 48 may be introduced into the deposition chamber 28 (step 54) for a period of about 2 hours (step 56). During the aforementioned 2 hour period a first inert protective coating layer may be applied to all surfaces of the piston. After the 2 hour application treatment, the precursor treatment may be halted (step 58) and the temperature of the deposition chamber 28 may be increased to approximately 375° C. (step 60). Once the deposition chamber 28 reaches a temperature of approximately 375° C., one or more precursors 48 may again be introduced into the deposition chamber 28 (step 62) for a period of about 3 hours (step 64). The second application of one or more precursors 48 may be applied over the first application to the piston. In some embodiments, the second application of one or more precursors may include the same or different precursors utilized in the first application.

Figure 3:
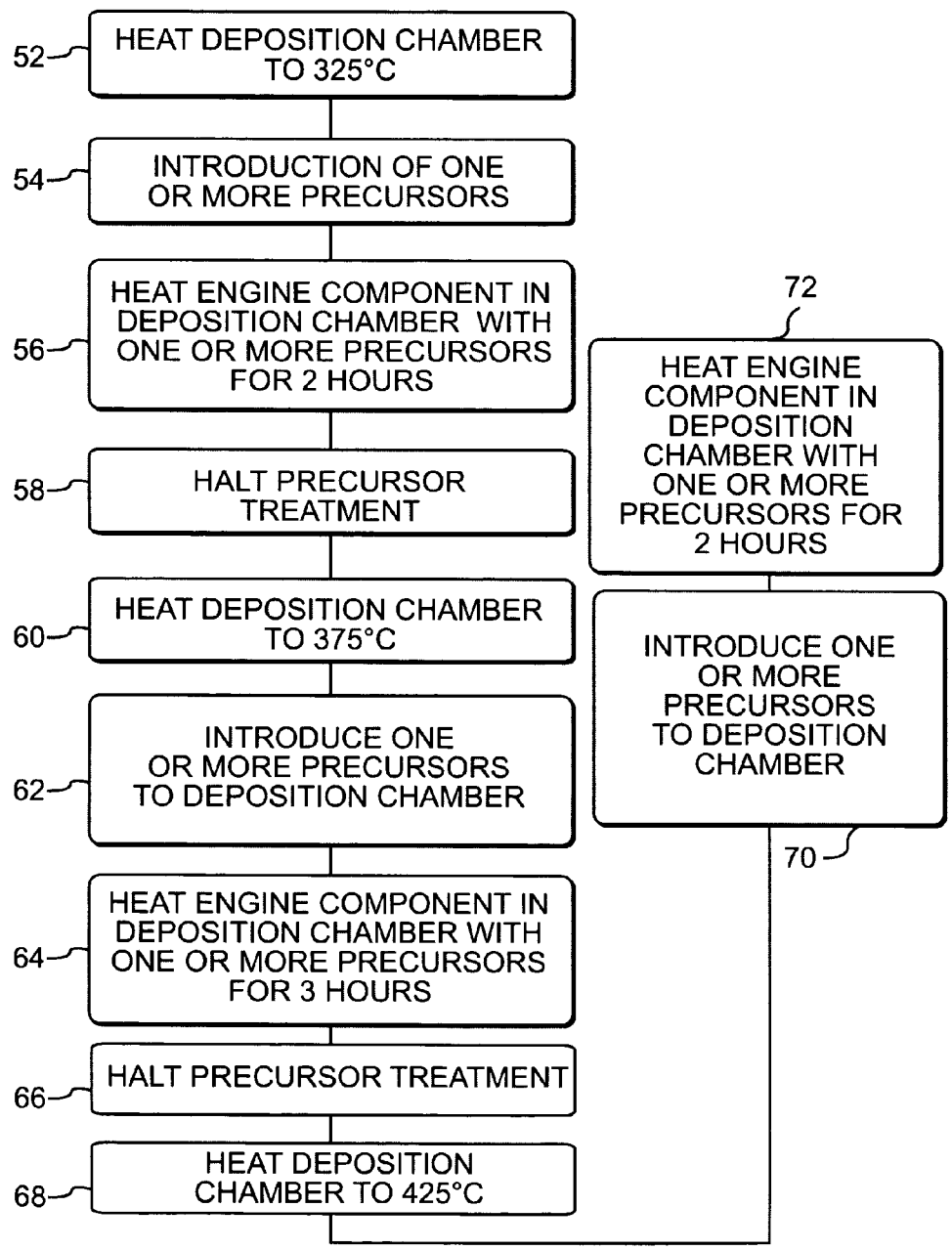
FIG. 3 provides a schematic diagram of the metal organic chemical vapor deposition process according to another exemplary disclosed embodiment.

In another embodiment illustrated in FIG. 3, another inert protective coating layer may be applied to the engine component 30. Using the piston coating example above, after the second application of precursors 48 for about 3 hours at approximately 375° C. (step 64), the precursor treatment may be halted (step 66) and the temperature of the deposition chamber 28 may be increased to approximately 425° C. (step 68). Once the deposition chamber 28 reaches a temperature of approximately 425° C., precursors 48 may again be introduced into the deposition chamber 28 (step 70) for a period of about 2 hours (step 72). The third application of precursors 48 may be applied over the first and second application to the piston. In some embodiments, the third application of precursors may include the same or different precursors utilized in the first and second applications.

The system and process of the disclosed embodiment may produce one or more inert protective coating layers on an outer surface of the engine components 30. For example, when pistons of an engine are treated with the inert protective coating layer of the disclosed embodiment, contaminants and other undesirable deposits may be prevented from adhering to surfaces of the piston. This may allow the pistons to interact more freely with other engine components including, for example, engine cylinders. A reduction in friction may occur since opposing frictional forces, for example, are otherwise reduced from non-existent or reduced deposits resulting from the one or more inert protective coating layers of the disclosed embodiment. Furthermore, a reduction in friction may translate into facilitating the engine to maximize the power it produces. Additionally, the service life of the piston and associated components, such as piston rings, may also be extended due to the inert protective coating resisting potentially harmful contaminants. Hence, the overall engine may benefit through increased performance at greater efficiency provided by the disclosed embodiment. Other benefits resulting from increased engine performance may include a decrease in engine oil consumption and increased fuel economy.

An application of the disclosed embodiment utilizing MOCVD may produce a more continuous and uniform coverage of one or more inert protective coating layers which are applicable to generally all types of shapes including, for example, those components having grooves, crevices, non-uniform materials and surfaces, and/or formations. Thus, a further benefit of the disclosure may include a resulting inert protective coating layer having a thickness range of 1-5 microns. In some embodiments, a total thickness range of approximately 2 microns may be achieved on coatings of engine components, such as pistons. The disclosed total thickness range may be obtained for all embodiments disclosed herein including, for example, the combination of the first and second application or the combination of the first, second and third application. The disclosed total thickness range may also be obtained for all embodiments disclosed herein including, for example, one or more similar or different kinds of precursors 48 utilized in the combination of the first and second application or the combination of the first, second and third application.

It will be apparent to those skilled in the art that various modifications and variations can be made in the disclosed MOCVD system and methods without departing from the scope of the disclosure. Additionally, other embodiments of the MOCVD system and methods will be apparent to those skill in the art from consideration of the specification. It is intended that the specification and examples be considered as exemplary only, with a true scope of the disclosure being indicated by the following claims and their equivalents.

What is claimed is:

1. A method of applying one or more inert oxide layers on at least one substrate surface comprising:
   disposing the substrate surface within a deposition chamber;
   heating the deposition chamber to a temperature of approximately 325° C.;
   supplying one or more precursors to the deposition chamber at approximately 325° C.;
   subjecting the substrate surface to the one or more precursors at approximately 325° C. for about two hours;
   halting the application of one or more precursors;
   heating the deposition chamber to a temperature of approximately 375° C.;
   supplying one or more precursors to the deposition chamber at approximately 375° C.; and
   subjecting the substrate surface to the one or more precursors at approximately 375° C. for about three hours to form the inert oxide layer.

2. The method of claim 1, further including:
   forming the inert oxide layer having a thickness of approximately 1-5 microns.

3. The method of claim 1, further including:
   selecting the precursors from the group consisting of alumina, alumina-silica, alumina tantalum and alumina magnesium oxide based materials.

4. The method of claim 1, further including:
   selecting the one or more precursors from the group consisting of aluminum acetylacetonate, aluminum magnesium isopropoxide, tantalum ethoxide, tantalum tetraethoxide 2,4pentadionate, tetraethoxysilane, and tetyramethoxylane.

5. The method of claim 1, further including:
purging the deposition chamber with an inert gas prior to supplying one or more precursors to the deposition chamber.

6. The method of claim 5, wherein the inert gas includes argon gas.

7. The method of claim 1, further including:
distributing argon gas to one or more precursors in a reagent container;
heating the reagent container between approximately 50° C. and 200° C. to mix the one or more precursors with the argon gas; and
supplying the one or more precursors via the argon gas to the deposition chamber in the supplying steps.

8. The method of claim 7, further including:
distributing the one or more precursors to a mixing container via the argon gas;
distributing a second inert gas to the mixing chamber;
heating the mixing chamber to react the second inert gas with the one or more precursors; and
supplying the reacted one or more precursors via the argon gas to the deposition chamber in the supplying steps.

9. The method of claim 8, wherein the second inert gas includes $O_2$.

10. A method of applying one or more inert oxide layers on at least one substrate surface comprising:
disposing the substrate surface within a deposition chamber;
heating the deposition chamber to a temperature of approximately 325° C.;
supplying one or more precursors to the deposition chamber at approximately 325° C.;
subjecting the substrate surface to the one or more precursors at approximately 325° C. for about two hours;
halting the application of one or more precursors;
heating the deposition chamber to a temperature of approximately 375° C.;
supplying one or more precursors to the deposition chamber at approximately 375° C.;
subjecting the substrate surface to the one or more precursors at approximately 375° C. for about three hours to form the inert oxide layer;
halting the treatment of one or more precursors after subjecting the substrate surface to the one or more precursors at approximately 375° C. for about three hours;
heating the deposition chamber to a temperature of approximately 425° C.;
supplying one or more precursors to the deposition chamber at approximately 425° C.; and
subjecting the substrate surface to the one or more precursors at approximately 425° C. for about two hours to form an additional inert oxide layer over the first formed inert oxide layer.

11. The method of claim 10, further including:
forming the first formed inert oxide layer and the additional inert oxide layer having a thickness of approximately 1-5 microns.

12. The method of claim 10, further including:
selecting the precursors from the group consisting of alumina, alumina-silica, alumina tantalum and alumina magnesium oxide based materials.

13. The method of claim 10, further including:
selecting the one or more precursors from the group consisting of aluminum acetylacetonate, aluminum magnesium isopropoxide, tantalum ethoxide, tantalum tetraethoxide 2,4pentadionate, tetraethoxysilane, and tetyramethoxylane.

14. The method of claim 10, wherein the substrate surface includes an engine component.

15. The method of claim 14, wherein the method includes a MOCVD coating process.

16. A method of applying a coating over a substrate surface of an engine component comprising: inserting the engine component within a deposition chamber;
heating the deposition chamber, while the engine component is inside the deposition chamber, from ambient temperature to a temperature between approximately 325° C. and 500° C.;
supplying one or more precursors to the heated deposition chamber; and
subjecting the engine component to the one or more precursors for about five hours to form an inert oxide layer over the substrate surface of the engine component having a thickness of approximately 1-5 microns, wherein the step of subjecting the engine component to the one or more precursors for about five hours further includes:
subjecting the substrate surface to the one or more precursors at approximately 325° C. for about two hours;
halting the application of one or more precursors;
heating the deposition chamber to a temperature of approximately 375° C.;
supplying one or more precursors to the deposition chamber at approximately 375° C.; and
subjecting the substrate surface to the one or more precursors at approximately 375° C. for about three hours to form the inert oxide layer.

17. The method of claim 16, further including:
purging the deposition chamber with argon gas prior to supplying one or more precursors to the deposition chamber.

18. The method of claim 16, including:
selecting the one or more precursors from the group consisting of aluminum acetylacetonate, aluminum magnesium isopropoxide, tantalum ethoxide, tantalum tetraethoxide 2,4pentadionate, tetraethoxysilane, and tetyramethoxylane.

19. The method of claim 16, wherein the method includes a MOCVD coating process.

* * * * *